(12) United States Patent
Lu et al.

(10) Patent No.: US 12,400,881 B2
(45) Date of Patent: Aug. 26, 2025

(54) APPARATUS AND METHOD OF SUBSTRATE EDGE CLEANING AND SUBSTRATE CARRIER HEAD GAP CLEANING

(71) Applicant: Applied Materials, Inc., Santa Clara, CA (US)

(72) Inventors: Wei Lu, Fremont, CA (US); Jimin Zhang, San Jose, CA (US); Jianshe Tang, San Jose, CA (US); Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/381,261

(22) Filed: Oct. 18, 2023

(65) Prior Publication Data
US 2024/0047238 A1    Feb. 8, 2024

Related U.S. Application Data

(62) Division of application No. 17/091,105, filed on Nov. 6, 2020, now Pat. No. 11,823,916.

(51) Int. Cl.
H01L 21/67 (2006.01)
H01L 21/02 (2006.01)
H01L 21/687 (2006.01)

(52) U.S. Cl.
CPC .. *H01L 21/67051* (2013.01); *H01L 21/02087* (2013.01); *H01L 21/67248* (2013.01); *H01L 21/68721* (2013.01)

(58) Field of Classification Search
CPC ......... H01L 21/67051; H01L 21/02087; H01L 21/67248; H01L 21/68721;
(Continued)

(56) References Cited

U.S. PATENT DOCUMENTS

| 7,044,832 B2 * | 5/2006 | Yilmaz | B24B 37/345 451/5 |
| 2006/0255016 A1 | 11/2006 | Svirchevski et al. | |

(Continued)

FOREIGN PATENT DOCUMENTS

| CN | 111469046 A | 7/2020 |
| JP | 2016-043442 A | 4/2016 |

(Continued)

OTHER PUBLICATIONS

International Search Report/ Written Opinion issued to PCT/US2021/053907 on Jan. 10, 2022.

(Continued)

*Primary Examiner* — Joshua L Allen
*Assistant Examiner* — Christopher Remavege
(74) *Attorney, Agent, or Firm* — Patterson + Sheridan, LLP

(57) ABSTRACT

The present disclosure relates to load cups that include an annular substrate station configured to receive a substrate. The annular substrate station surrounds a nebulizer located within the load cup. The nebulizer includes a set of energized fluid nozzles disposed on an upper surface of the nebulizer adjacent to an interface between the annular substrate station and the nebulizer. The set of energized fluid nozzles are configured to release energized fluid at an upward angle relative to the upper surface.

20 Claims, 5 Drawing Sheets

(58) Field of Classification Search
CPC ......... H01L 21/67219; H01L 21/67092; B24B 37/30; B24B 37/32; B24B 37/34; B24B 55/06; B24B 37/345; B24B 53/017
See application file for complete search history.

(56) References Cited

U.S. PATENT DOCUMENTS

| | | | |
|---|---|---|---|
| 2010/0291841 A1* | 11/2010 | Sung | B24B 53/017 451/177 |
| 2016/0052104 A1* | 2/2016 | Ishibashi | B24B 37/10 156/345.14 |
| 2019/0157071 A1* | 5/2019 | Peng | H01L 21/30625 |
| 2020/0234995 A1* | 7/2020 | Rangarajan | H01L 21/67051 |
| 2020/0331113 A1 | 10/2020 | Soundararajan et al. | |

FOREIGN PATENT DOCUMENTS

| | | |
|---|---|---|
| JP | 2018046260 A | 3/2018 |
| JP | 2018-0133512 A | 8/2018 |
| KR | 10-2016-0023568 A | 3/2016 |
| KR | 10-2018-0137136 A | 12/2018 |
| KR | 10-2019-0018728 A | 2/2019 |
| WO | 2008079449 A | 7/2008 |
| WO | 2020/150072 A1 | 7/2020 |

OTHER PUBLICATIONS

Search Report for Taiwan Application No. 110140518 dated Feb. 3, 2023.
Office Action for Taiwan Application No. 110140518 dated Mar. 8, 2023.
JP Office Action dated Oct. 10, 2023 for Application No. 2022-544300.
Notice of Preliminary Rejection Dated May 28, 2024, re: Korean patent application No. 10-2022-7026263.
Search Report issued to Taiwan Application No. 112140745 on Feb. 24, 2025 in 8 pages.

* cited by examiner

APPARATUS AND METHOD OF SUBSTRATE EDGE CLEANING AND SUBSTRATE CARRIER HEAD GAP CLEANING

CROSS-REFERENCE TO RELATED APPLICATIONS

This application is a divisional of U.S. patent application Ser. No. 17/091,105, filed Nov. 6, 2020, which is herein incorporated by reference in its entirety.

BACKGROUND

Field

Embodiments of the present disclosure generally relate to substrate processing, and more specifically to substrate processing tools and methods thereof.

Description of the Related Art

An integrated circuit is typically formed on a substrate by the sequential deposition of conductive, semiconductive or insulative layers on a silicon substrate. Fabrication includes depositing a filler layer over a non-planar surface, and planarizing the filler layer until the non-planar surface is exposed. A conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be needed to planarize a dielectric layer at the substrate surface for photolithography.

Chemical mechanical polishing (CMP) is one accepted method of planarization. This planarization method includes mounting the substrate on a carrier head or polishing head of a CMP apparatus. The exposed surface of the substrate is placed against a rotating polishing disk pad or belt pad. The carrier head provides a controllable load on the substrate to urge the device side of the substrate against the polishing pad. A polishing slurry, including at least one chemically-reactive agent, and abrasive particles if a standard pad is used, is supplied to the surface of the polishing pad.

The substrate is typically retained below the carrier head against a membrane within a retaining ring. Moreover a gap is present between an outer edge of the substrate and an inner perimeter of the retaining ring when the substrate is in the carrier head. In addition, a gap is present between an outer edge of the membrane and an inner perimeter of the retaining ring. These gaps and other areas proximate to the outer edge of the substrate can accumulate polishing slurry and organic residues during processing. These residues can remain on the substrate edge and/or dislodge during processing and cause defects to the substrate and affect the efficiency of the CMP apparatus. Thus, there is a need for a method of removing residue from the substrate edge and removing residue from the gaps in the carrier head surrounding the substrate. There is also a need for an apparatus for removing the residue from the substrate edge before the substrate is transferred off of the carrier head and for removing the residue from the gaps surrounding the membrane of the carrier head.

SUMMARY

In one embodiment, a load cup is provided having an annular substrate station configured to receive a substrate and a nebulizer located within the load cup and surrounded by the annular substrate station. The nebulizer has a set of energized fluid nozzles disposed on an upper surface of the nebulizer adjacent to an interface between the annular substrate station and the nebulizer. The set of energized fluid nozzles are configured to release energized fluid at an upward angle relative to the upper surface.

In another embodiment, a method of cleaning a chemical mechanical polishing system is provided including directing energized fluid from a set of energized fluid nozzles of a load cup at an edge of a substrate disposed in a carrier head. The carrier head has a retaining ring to retain the substrate below a membrane of the carrier head. The method includes unloading the substrate from the carrier head and directing the energized fluid from the set of energized fluid nozzles to a gap formed between an outer edge of the membrane and an inner perimeter of the retaining ring.

In another embodiment, a chemical mechanical polishing system includes a carrier head having a retaining ring to retain a substrate below a membrane of the carrier head the chemical mechanical polishing system includes a load cup having a set of energized fluid nozzles disposed on an upper surface of an outer portion of the load cup. The set of energized fluid nozzles are configured to direct energized fluid to a gap between an outer edge of the membrane and an inner perimeter of the retaining ring.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to load cups that are configured with energized fluid nozzles which expel tunable energized fluid jets to clean the edges of a substrate disposed in a carrier head before the substrate is unloaded from the carrier head without overheating the substrate. The energized fluid jets expelled from the energized fluid nozzles have characteristics that are favorable for penetrating and effectively cleaning narrow gaps in the carrier head between a hydrophobic membrane and an inner perimeter of a retaining ring of the carrier head. According to one or more embodiments of the disclosure, it has been discovered that certain properties of the energized fluid jets, such as one or more of a flat fan shape, high pressures, high temperatures, gas phase stream, solid, meltable particles for bombardment, sonic wave generation, and combination(s) thereof may be advantageously used for enhanced and quick cleaning. It has also been found that each of the energized fluid nozzles can be used in combination with respective fluid spray nozzles (e.g., deionized water spray nozzles) for improved control such as temperature control.

Figure 1:
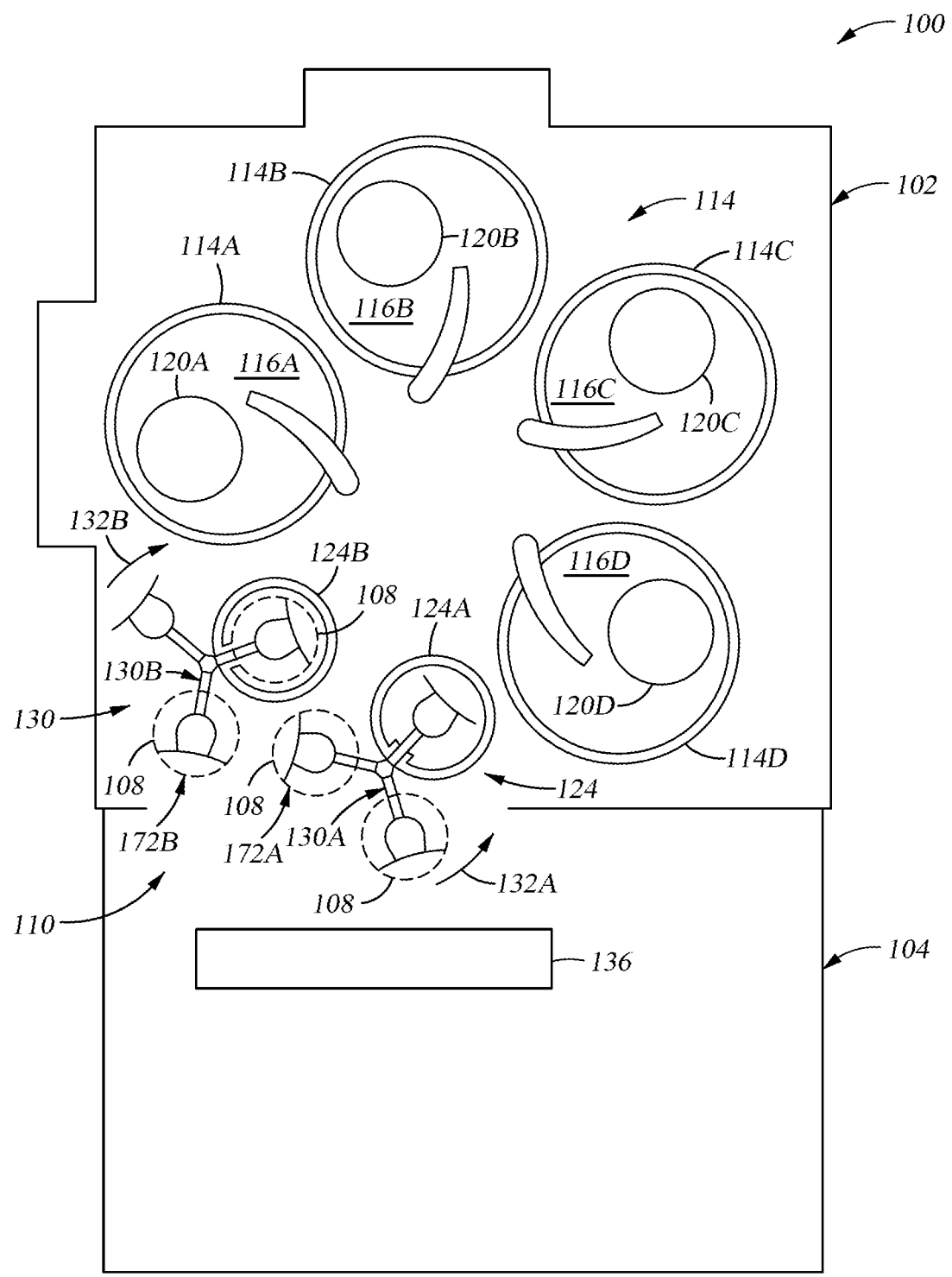
FIG. 1 depicts a top, plan view of a chemical mechanical polishing (CMP) system according to an embodiment.

FIG. 1 depicts a top, plan view of a chemical mechanical polishing (CMP) system 100 according to an embodiment disclosed herein. Although a CMP system is illustrated in FIG. 1 and described herein, the concepts disclosed herein may be applied to other substrate processing devices. The CMP system 100 includes a polishing section 102 and a cleaning and drying section 104 that process (e.g., wash and/or polish) substrates 108. The CMP system 100 includes other sections that perform other processes on the substrates 108. As used herein, substrates include articles used to make electronic devices or circuit components. Substrates include semiconductor substrates such as silicon-containing substrates, patterned or unpatterned substrates, glass plates, masks, and the like. A pass-through 110 is an opening between the polishing section 102 and the cleaning and drying section 104 that accommodates the transfer of the substrates 108.

The polishing section 102 includes one or more polishing stations 114, such as individual polishing stations 114A-114D. Each of the polishing stations 114 include a polishing pad, such as individual polishing pads 116A-116D. The polishing pads rotate against surfaces of the substrates 108 to perform various polishing processes. One or more slurries (not shown) are applied between the substrate 108 and the polishing pad 116A-116D to process the substrate.

The polishing section 102 includes a plurality of carrier heads 120 that maintain the substrates 108 against the polishing pads 116A-116D during polishing. Each of the polishing stations 114A-114D may include a single head, such as individual carrier heads 120A-120D. The carrier heads 120A-120D secure the substrates 108 therein as the carrier heads 120A-120D are transported to and from the polishing stations 114A-114D. For example, the carrier heads 120A-120D secure the substrates 108 therein as the carrier heads 120A-120D are transported between load cups 124 (e.g., individual load cups 124A, 124B) and the polishing stations 114A-114D. The load cups 124A, 124B transport the substrates 108 between the carrier heads 120A-120D and substrate exchangers 130 (e.g., individual exchangers 130A, 130B). A first substrate exchanger 130A rotates in a first direction 132A and a second exchanger 130B rotates in a second direction 132B, which may be opposite or the same as the first direction 132A.

The cleaning and drying section 104 includes a robot 136 that transfers the substrates 108 through the pass-through 110 to and from the substrate exchangers 130A, 130B at various access locations 172A, 172B. The robot 136 also transfers the substrates 108 between stations (not shown) in the cleaning and drying section 104 and the substrate exchangers 130A, 130B.

Figure 2A:
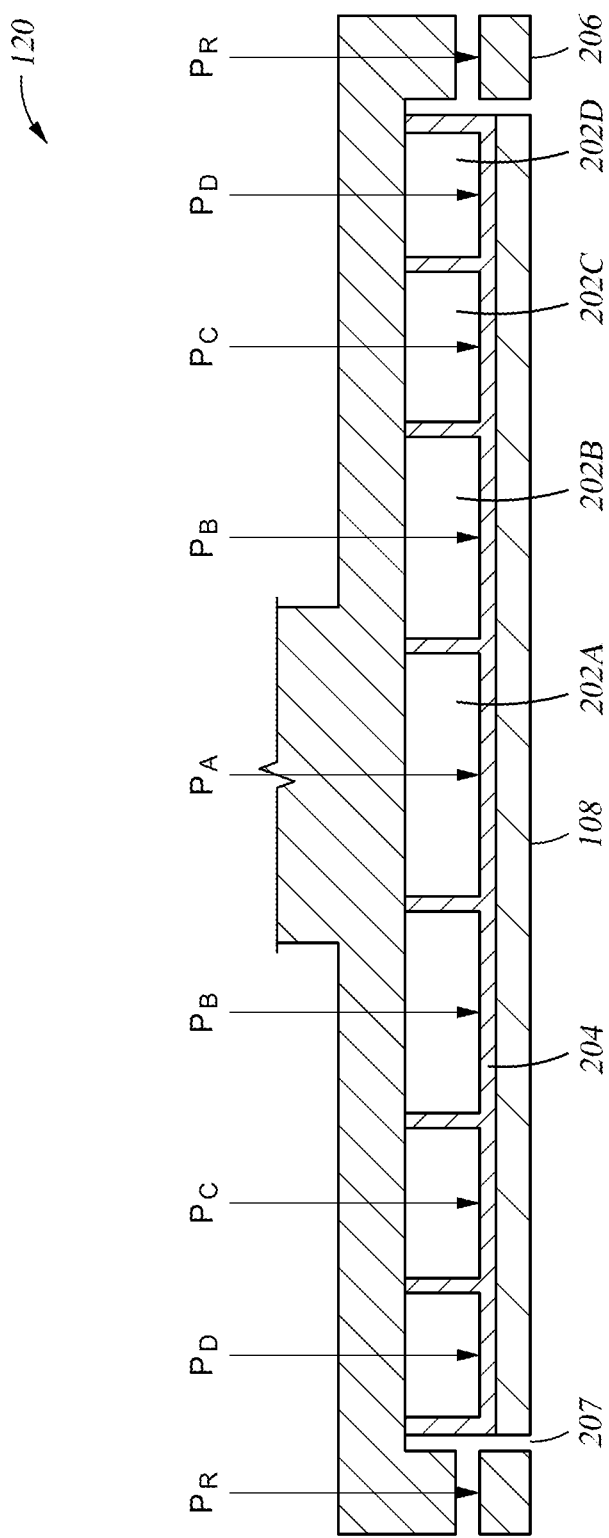
FIG. 2A depicts a partial side view of a polishing apparatus according to an embodiment.
Figure 2B:
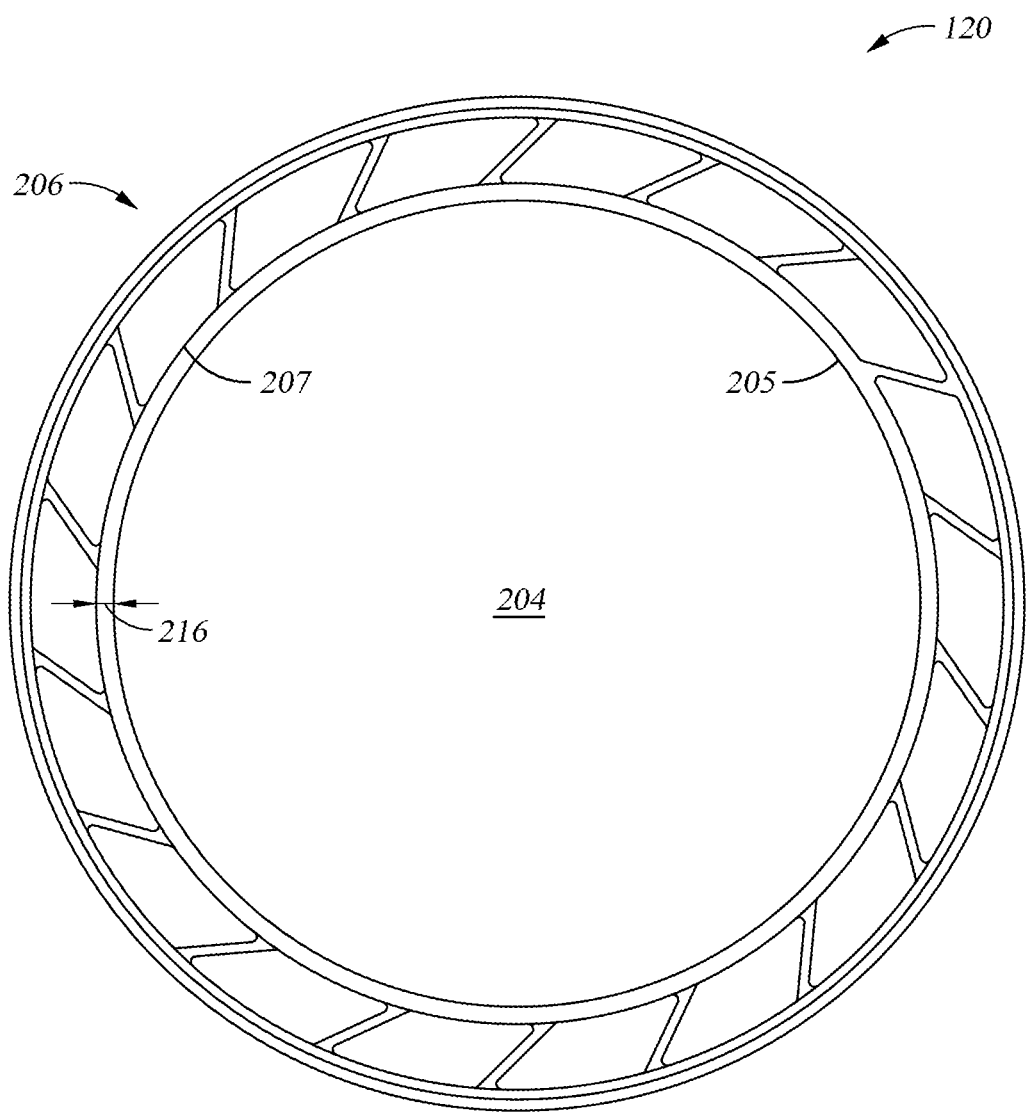
FIG. 2B depicts a bottom view of a polishing apparatus according to an embodiment.

FIGS. 2A and 2B depict a side view and a bottom view of the carrier head 120 according to some embodiments, which can be any of carrier heads 120A-120D in FIG. 1. The carrier head 120 includes a retaining ring 206 to retain the substrate 108 below a membrane 204. The membrane 204 is a flexible, hydrophobic membrane 204. The membrane outer perimeter 205 is surrounded by an inner perimeter 207 of the retaining ring 206. A gap 216 is formed between the inner perimeter 207 of the retaining ring 206 and the outer perimeter 205 of the membrane 204. In some embodiments, the gap 216 is about 0.5 mm to about 3 mm, such as about 1 mm to about 2 mm. The carrier head 120 includes one or more independently controllable pressurizable chambers (e.g., 202A, 202B, 202C, 202D) defined by the membrane 204. Each of the pressurizable chambers have associated pressures ($P_A$, $P_B$, $P_C$, and $P_D$), and $P_R$ refers to the pressure exerted on the retaining ring 206 during processing. During processing, as the carrier head 120 rotates the substrate 108 while pressing it against the polishing pad (e.g., 116A-116D), polishing slurry, debris and residue can accumulate on the substrate 108 edge, the substrate bevel areas, and other locations such as within the gap 216.

Without being bound by theory, it is believed that because the membrane 204 is hydrophobic, the capillary and/or meniscus forces surrounding the outer perimeter 205 of the membrane 204 prevent conventional rinsing water, e.g., deionized (DI) water, from readily penetrating these gaps and features. The residue and particles can build up over time and be released during processing potentially causing scratches on the substrate 108. One solution may be to rinse the membrane 204 with the membrane 204 facing upwards; however, this process is not conventionally used in the industry at least because it would affect throughput and cause water to bead up. A rinse process with the membrane 204 facing down is unable to wet the hydrophobic membrane surfaces and is limited in effectiveness for cleaning. It has been discovered that using a high pressure steam dislodges slurry residues and particles by using both kinetic and thermal energies. In some embodiments, the steam is effective for cleaning the gaps in the carrier head 120 both when the substrate 108 is not in place, and when the substrate 108 is retained in the carrier head 120.

Figure 3A:
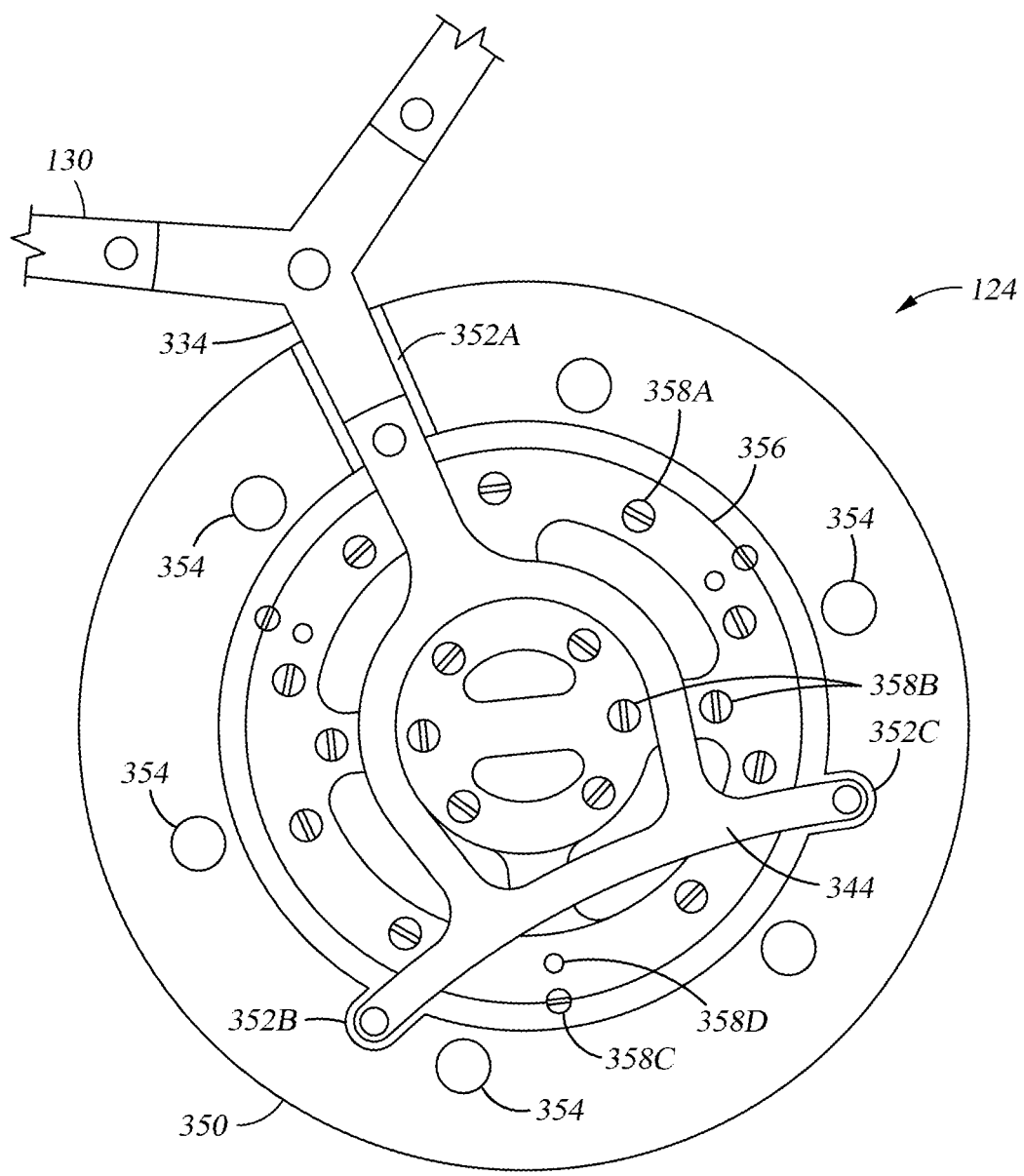
FIG. 3A depicts a top, plan view of a load cup according to an embodiment.

FIG. 3A depicts a top, plan view of the load cup 124 (e.g., 124A or 124B) according to an embodiment. The load cup 124 includes a substrate station 350 that has an annular shape. The substrate station 350 moves vertically to place substrates onto a blade 334 of the substrate exchanger 130 (e.g., 130A, 130B) and to remove the substrates 108 from the blade 334. The blade 334 is rotatable to the access location 172A, 172B for loading and unloading of the substrate 108 by the robot 136 (FIG. 1).

The substrate station 350 includes notches (e.g., 352A, 352B, 352C) to receive the blade 334. The distal end 344 of the blade is received by notches 352B and 352C. The proximate end of the blade 334 is received by notch 352A. The substrate 108 rests on raised features of the substrate station 350. As the substrate station 350 moves in an upward direction and removes the substrate 108 from the blade 334, the substrate 108 is positioned within a plurality of pins 354, which create a pocket to center the substrate 108.

The load cup 124 includes a nebulizer 356 having a plurality of various nozzles (e.g., 358A, 358B, 358C, 358D) configured to spray fluids (e.g., deionized water) onto the blade 334, a substrate 108 (not shown in FIG. 3A) on the blade 334, a substrate on the carrier head 120, and/or a carrier head 120 (not shown in FIG. 3A) located above the load cup 124. The nebulizer 356 includes a set of first nozzles 358A disposed around the outer portion of the nebulizer 356, for example, to rinse the substrate 108, and a set of second nozzles 358B disposed in an array along a diameter of the nebulizer 356, for example, to rinse the membrane 204 of the carrier head 120, when respectively positioned over the load cup 124. The nebulizer 356 includes a set of third nozzles 358C on the outer portion of the nebulizer 356 configured to spray portions of the carrier head 120, such as the gap 216 between the outer perimeter 205 of the membrane 204 and the inner perimeter 207 of the retaining ring 206, when the carrier head 120 is positioned over the load cup 124, with or without the substrate 108. The third nozzles 358C (e.g., spray nozzles) are also configured to spray an outer edge of the substrate 108, while retained in the carrier head 120, such as a gap between the outer edge of the substrate 108 and the inner perimeter 207 of the retaining ring 206. The third nozzles 358C are coupled to a rinse solution, such as deionized water at room temperature, such as about 10° C. to about 40° C. Each of the third nozzles 358C are coupled to atomizers.

The nebulizer 356 includes a set of fourth nozzles 358D (e.g., energized fluid nozzles). Each of the fourth nozzles 358D are disposed proximate to each third nozzle 358C on an upper surface of the nebulizer 356 at an outer portion of the nebulizer 356. In some embodiments, the energized fluid is deionized water (DIW), DIW and nitrogen, DIW and clean dry air (CDA), water ice particles and nitrogen, water ice particles and CDA, carbon dioxide ice, DIW energized with ultrasonic or megasonic generators, or combination(s) thereof. Without being bound by theory, it is believed that certain mixtures including ice particles can be used to bombard and dislodge debris within small voids and gaps. The energized fluid is gas phase fluid and/or a mixed phase fluid, such as vapor and/or steam. The temperature of the energized fluid, such as steam is about 80° C. to about 150° C., such as about 100° C. to about 120° C., such as a temperature at or above a saturation temperature of the fluid. The pressure applied to energize the fluid is about 30 psi to about 140 psi, such as about 40 psi to about 50 psi. Other pressures and temperatures are also contemplated, such as for dry ice and other energized fluids.

In some embodiments, the fluid is energized by pressurizing a fluid, acoustically energized (e.g., via acoustic cavitation), pneumatically assisted (e.g., using liquid mixed with a pressured gas), or combination(s) thereof. Other methods and combinations are also possible. Acoustic cavitation includes ultrasonically or megasonically energizing the fluid to dislodge residue and debris. Acoustically energizing fluid uses a piezoelectric transducer (PZT) operating in a frequency range from a lower ultrasonic range (e.g., about 20 KHz) to an upper megasonic range (e.g., about 2 MHz). Other frequency ranges can be used. The shape of a suitable acoustic energy source generator (e.g., a PZT) is rectangular. The acoustic source generator is coupled to the fourth nozzle 358D.

Figure 3B:
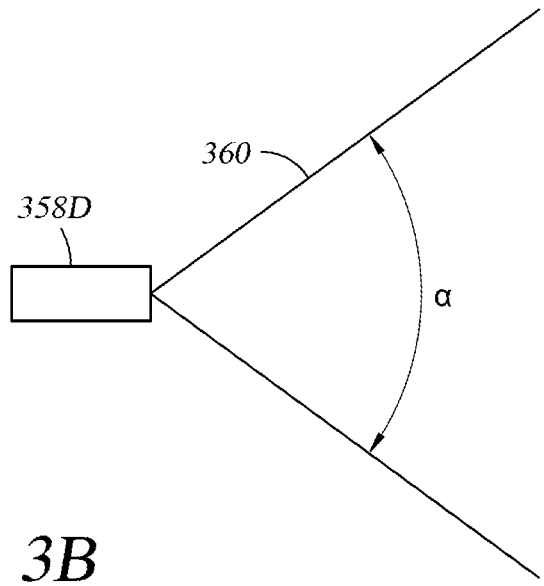
FIG. 3B depicts a schematic side view of a spray pattern for a nozzle according to an embodiment.

The fourth fluid nozzles 358D are oriented upwards, perpendicular (e.g., about 90 degrees) to the upper surface of the nebulizer 356. Other angles relative to the upper surface of the nebulizer 356 is also contemplated, such as about 45 degrees to about 100 degrees, in which 45 degrees is angle that oriented radially outward relative to the nebulizer 356. Additionally each of the fourth fluid nozzles 358D are configured to direct fluid in a flat fan jet (e.g., 360 shown in FIG. 3B). FIG. 3B depicts a schematic side view of a spray pattern of a flat fan jet 360 for the third nozzle 358C and/or the fourth nozzle 358D according to some embodiments. The flat fan jet is substantially parallel with a portion of an inner perimeter of the annular substrate station 350 and a jet angle α pivoting at a tip of the fourth fluid nozzle 358D from a first edge to a second edge of the flat fan jet is about 30 degrees to about 50 degrees, such as about 40 degrees. In some embodiments, the nebulizer 356 includes about 1 to about 5 fourth fluid nozzles 358D, such as 2, 3, or 4 fourth fluid nozzles 358D. Each of the fourth fluid nozzles 358D are equally spaced around the outer portion of the nebulizer 356. In some embodiments, the nebulizer 356 includes about 1 to about 5 third nozzles 358C, and each fourth fluid nozzle 358D is disposed proximate to a respective third nozzle 358C.

Figure 4:
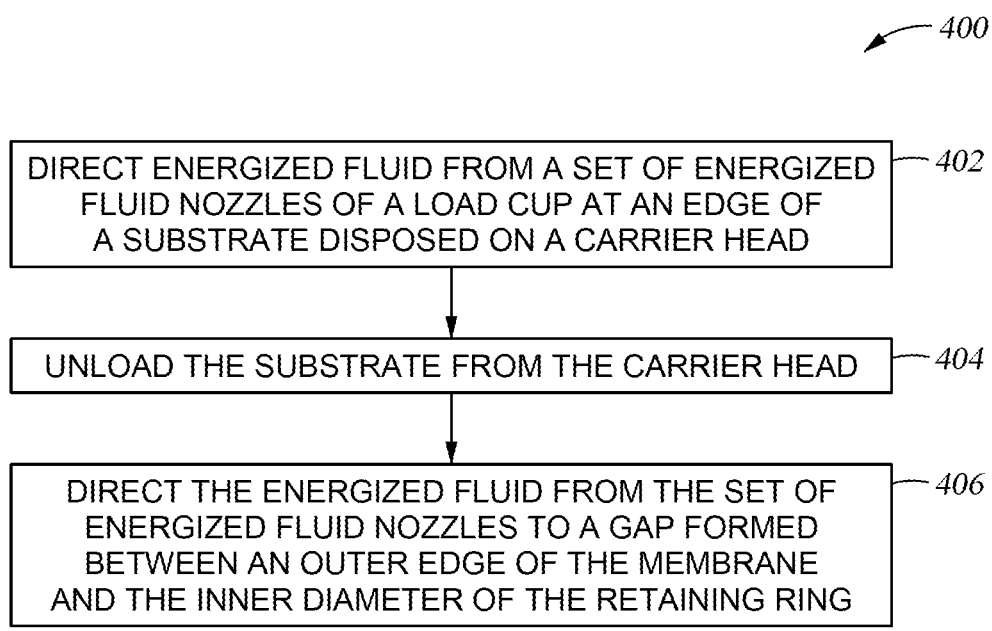
FIG. 4 depicts a flow diagram of a method for processing a substrate according to an embodiment.

FIG. 4 includes a flow diagram of a method for processing substrate. The method 400 includes, an operation 402, directing energized fluid from a set of energized fluid nozzles (e.g., 358D) of a load cup (e.g., 124) at an edge of a substrate (e.g., 108) disposed in a carrier head (e.g., 120). The carrier head 120 includes the retaining ring 206 to retain the substrate 108 below the membrane 204 of the carrier head 120. The substrate 108 edge is maintained at a temperature of about 60° C. to about 70° C., as measured from outside of the carrier head 120. In some embodiments, after polishing the substrate 108 in the polishing section 102, the substrate 108 is cooled to room temperature, such as about 20° C. to about 40° C. during rinsing and/or removing the substrate 108 from the polishing section 102. It is believed that maintaining a low substrate 108 temperature, reduces a potential for corrosion during substrate transfer. The method described herein controls substrate temperature during cleaning, such as by localizing energized fluid to the substrate edge areas. In some embodiments, the energized fluid (e.g., steam) is simultaneously directed to the edge of the substrate 108 while spraying DI water from spray nozzles (e.g., 358C) at the edge of the substrate 108. In some embodiments, the DI water is sprayed immediately after the energized fluid is directed to the edge of the substrate 108. The combined jet of the DI water and the energized fluid is controlled by adjusting the pressure of the energized fluid and the amount of water sprayed. In particular, a temperature of the combined jet is controlled to maintain the temperature of the substrate 108 below about 70° C. It is believed that maintaining a substrate 108 temperature below about 70° C. reduces undesirable effects on the substrate 108. Residue and debris is dislodged from the edge of the substrate 108 without overheating the substrate and portions of the substrate carrier head 120 such as the retaining ring 206. Managing temperature reduces the risk of material degradation of the substrate 108 and carrier head 120. Spraying water also acts to rinse away the dislodged residue and debris. In some embodiments, the energized fluid is directed to the substrate edge while the substrate 108 is in the carrier head 120 and rotating with the carrier head. The substrate 108 is secured to the carrier head 120 by application of a vacuum pressure to the membrane. The low clearance between the inner perimeter of the membrane and the substrate edge in combination with the hydrophobic properties of the membrane make it difficult to clean the substrate edge and bevel areas using conventional methods. The methods described herein provides an energized fluid having a fan jet shape and angle that is directed to the substrate edge while the substrate is secured to the carrier head 120 for enhanced cleaning.

In operation 404, the substrate 108 is unloaded from the carrier head 120, such as by loading the substrate 108 onto a substrate exchanger (e.g., 130A, 130B) and rotating the substrate exchanger. After the substrate 108 is removed from the carrier head, the load cup 124 is returned to a position proximate the carrier head 120, and energized fluid is directed to the empty carrier head 120 at the gap 216 formed between the outer perimeter 205 of the membrane 204 and the inner perimeter 207 of the retaining ring 206 in operation 406. In some embodiments, DI water is sprayed immediately after the energized fluid to rinse away any dislodged residue and debris.

Thus, the present disclosure relates to load cups that are configured with energized fluid nozzles which expel tunable energized fluid jets to clean the edges of a substrate disposed in a carrier head before the substrate is unloaded from the carrier head without overheating the substrate. The energized fluid jets expelled from the energized fluid nozzles have characteristics that are favorable for penetrating and effectively cleaning narrow gaps in the carrier head between a hydrophobic membrane and an inner perimeter of a retaining ring of the carrier head. Each of the energized fluid nozzles can be used in combination with respective fluid spray nozzles (e.g., deionized water spray nozzles) for improved control such as temperature control.

What is claimed is:

1. A load cup comprising:
   an annular substrate station configured to receive a substrate; and
   a nebulizer located within the load cup and surrounded by the annular substrate station, the nebulizer comprising:
      a set of energized fluid nozzles disposed on an upper surface of the nebulizer adjacent to an interface between the annular substrate station and the nebulizer, wherein the set of energized fluid nozzles are configured to release energized fluid at an upward angle relative to the upper surface, the upward angle being about 45 degrees to about 100 degrees relative to the upper surface, the energized fluid nozzles configured to direct a fluid in a flat fan jet, wherein a flat portion of the flat fan jet is substantially parallel with an inner perimeter of the annular substrate station; and
      a set of fluid nozzles disposed on the upper surface of the nebulizer, radially outward of the set of energized fluid nozzles, wherein each fluid nozzle of the set of fluid nozzles is disposed proximate to a respective energized fluid nozzle of the set of energized fluid nozzles.

2. The load cup of claim 1, wherein the set of fluid nozzles is configured to deliver a spray of fluid.

3. The load cup of claim 2, wherein the energized fluid is steam and the spray of fluid is deionized (DI) water.

4. The load cup of claim 2, wherein a jet angle pivoting at a tip of the energized fluid nozzle from a first edge to a second edge of the flat fan jet is about 30 degrees to about 50 degrees.

5. The load cup of claim 2, wherein each of the set of fluid nozzles are coupled to atomizers such that fluid from the fluid nozzles is in a mist form.

6. The load cup of claim 1, wherein the upward angle of the energized fluid is about 90 degrees relative to the upper surface of the nebulizer.

7. The load cup of claim 1, wherein the set of energized fluid nozzles include about 1 to about 5 energized fluid nozzles equally spaced around the upper surface of an outer portion of the nebulizer.

8. A chemical mechanical polishing system comprising:
   a carrier head comprising a retaining ring to retain a substrate below a membrane of the carrier head; and
   a load cup comprising:
      a set of energized fluid nozzles disposed on an upper surface of an outer portion of the load cup, wherein the set of energized fluid nozzles are configured to direct energized fluid about 45 degrees to about 100 degrees relative to the upper surface and to a gap between an outer edge of the membrane and an inner perimeter of the retaining ring and are configured direct energized fluid in a flat fan jet, wherein a flat portion of the flat fan jet is substantially parallel with a portion of an inner perimeter of the retaining ring; and
      a set of fluid nozzles disposed on the upper surface of a nebulizer, radially outward of the set of energized fluid nozzles, wherein each fluid nozzle of the set of fluid nozzles is disposed proximate to a respective energized fluid nozzle of the set of energized fluid nozzles, each fluid nozzle directed about 45 degrees to about 100 degrees relative to the upper surface and towards the gap.

9. The chemical mechanical polishing system of claim 8, wherein a jet angle pivoting at a tip of each nozzle of the set of energized fluid nozzles from a first edge to a second edge of the flat fan jet is about 30 degrees to about 50 degrees.

10. The chemical mechanical polishing system of claim 8, further comprising atomizers coupled to each set of fluid nozzles.

11. The chemical mechanical polishing system of claim 8, wherein the set of energized fluid nozzles are disposed to such that the energized fluid is sprayed at about 90 degrees relative to an upper surface of the load cup.

12. The chemical mechanical polishing system of claim 8, wherein the membrane is hydrophobic and the gap formed between an outer perimeter of the membrane and the inner perimeter of the retaining ring is about 0.5 mm to about 2 mm.

13. A chemical mechanical polishing system comprising:
   a carrier head comprising a retaining ring to retain a substrate below a membrane of the carrier head;
   a load cup comprising:
      a first array of fluid nozzles disposed on an upper surface of an outer portion of the load cup, wherein the first array of fluid nozzles are directed about 45 degrees to about 100 degrees relative to the upper surface and towards a gap between an outer edge of the membrane and an inner perimeter of the retaining ring;
      a second array of fluid nozzles, each fluid nozzle of the second array of fluid nozzles disposed proximate and radially outward of a respective fluid nozzle of the first array of fluid nozzles, the second array of fluid nozzles being flat fan jet nozzles directed at the gap.

14. The chemical mechanical polishing system of claim 13, wherein the second array of fluid nozzles are arranged such that their spray is substantially parallel with a portion of an inner perimeter of the retaining ring.

15. The chemical mechanical polishing system of claim 13, wherein the flat fan jet of the second array of fluid nozzles is about 30 degrees to about 50 degrees.

16. The chemical mechanical polishing system of claim 13, further comprising a sonic generator coupled to the first array of nozzles.

17. The chemical mechanical polishing system of claim 13, wherein the membrane is a hydrophobic membrane.

18. The chemical mechanical polishing system of claim 13, wherein the load cup further comprises a nebulizer disposed radially inward of a movable substrate station.

19. The chemical mechanical polishing system of claim 18, wherein the first array of fluid nozzles and second array of fluid nozzles are disposed on the nebulizer.

20. The chemical mechanical polishing system of claim 19, further comprising a third array of fluid nozzles disposed in an array along a diameter of the nebulizer.

\* \* \* \* \*